United States Patent [19]
Olgaard

[11] Patent Number: 6,118,346
[45] Date of Patent: Sep. 12, 2000

[54] DYNAMIC MATCHING OF UP AND DOWN CURRENTS IN CHARGE PUMPS TO REDUCE SPURIOUS TONES

[75] Inventor: Christian V. Olgaard, Sunnyvale, Calif.

[73] Assignee: National Semiconductor Corp., Santa Clara, Calif.

[21] Appl. No.: 09/082,452

[22] Filed: May 20, 1998

[51] Int. Cl.[7] .................................. H03L 7/00; H03L 7/08
[52] U.S. Cl. .............................. 331/17; 331/25; 327/536; 327/537; 327/157
[58] Field of Search ..................... 331/17, 25; 327/536, 327/537, 157

[56] References Cited

U.S. PATENT DOCUMENTS

| 5,416,691 | 5/1995 | Croughwell | 363/60 |
| 5,485,125 | 1/1996 | Dufour | 331/17 |
| 5,532,636 | 7/1996 | Mar et al. | 327/543 |
| 5,592,120 | 1/1997 | Palmer et al. | 327/536 |

*Primary Examiner*—Arnold Kinkead
*Attorney, Agent, or Firm*—Skjerven, Morrill, MacPherson LLP; Edward C. Kwok

[57] ABSTRACT

A device in a phase-locked loop circuit that dynamically matches the currents in a charge pump to reduce the spurious tones during each charge pump event when the phase-locked loop is in lock. A regulator circuit is coupled to a first current source in a charge pump and is responsive to inverted up and down signals from a phase detector or to the currents of a charge pump. The integrator may adjust the first current to equal the second current when inverted up and down signals do not arrive at the regulator at the same time or when the loop filter voltage does not match the charge pump output voltage with both current sources of the charge pump are turned on but disconnected from the loop filter.

8 Claims, 6 Drawing Sheets

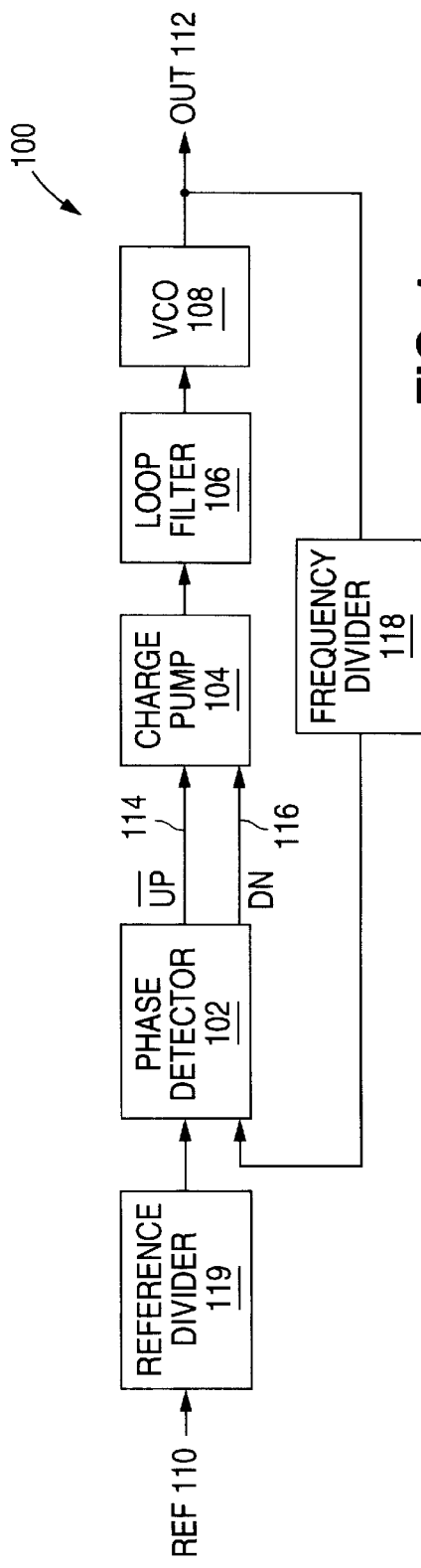
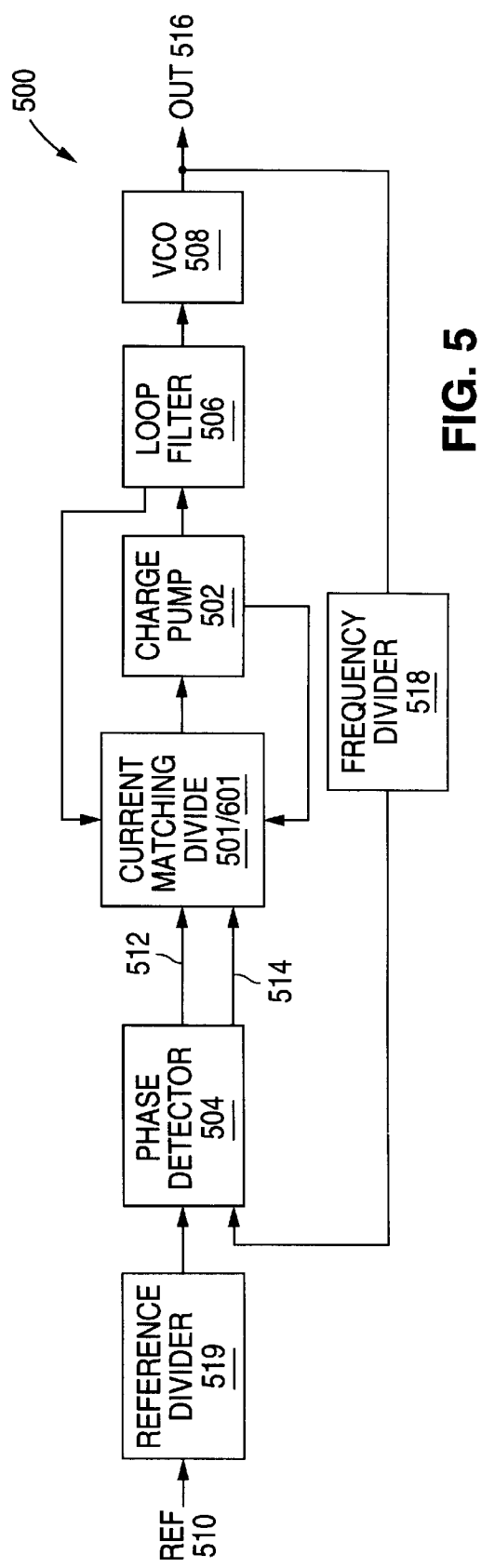

DYNAMIC MATCHING OF UP AND DOWN CURRENTS IN CHARGE PUMPS TO REDUCE SPURIOUS TONES

BACKGROUND

1. Field of the Invention

The present invention relates generally to phase-locked loops. Particularly, the invention relates to devices that minimize reference spurs from charge pumps used in phase-locked loops.

2. Discussion of Related Art

FIG. 1 shows a phase-locked loop (PLL) 100 including a phase detector 102, charge pump 104, loop filter 106, voltage controlled oscillator (VCO) 108, frequency divider 118, and reference divider 119.

VCO 108 outputs an oscillating signal, OUT 112, that is the output signal of PLL 100. The frequency of OUT 112 linearly corresponds to the voltage at the input of VCO 108. OUT 112 is fed to frequency divider 118 which divides the VCO frequency by a value N. The output signal of frequency divider 118 is fed back to phase detector 102, which compares the phase of OUT 112 to the phase of an input signal, equivalent to REF 110 divided by R by reference divider 119. When locked, the frequency of OUT 112 is the frequency of REF 110 times (N/R).

Phase detector 102 supplies two pulses that have a difference in duration proportional to the phase difference between the signal output from reference divider 114 and the signal output from frequency divider 118. For example, when the phase of OUT 112 divided by N lags the phase of REF 110 divided by R, the frequency of OUT 112 is increased by increasing the voltage at the loop filter 106. This voltage increase is achieved by supplying charge pump 104 a pulse of inverted UP 114 that has a duration longer than DN 116. When the frequency of OUT 112 divided by N is greater than that of REF 110 divided by R, phase detector 102 supplies DN 116 that is longer in duration than inverted UP 114.

Charge pump 104 responds to pulses of inverted UP 114 and DN 116 by outputting a current to loop filter 106, which often includes a large capacitor. The output signal of loop filter 106 is averaged to define a DC voltage at the input terminal of VCO 108. Charge pump 104 responds to pulses of inverted UP 114 by outputting positive current pulses that add charge to the capacitor of loop filter 106, raising the DC voltage at the input of VCO 108. Charge pump 104 responds to pulses of DN 116 by outputting negative current pulses that remove charge from the capacitor of loop filter 106, lowering the DC voltage at the input of VCO 108. Therefore, the difference in duration between inverted UP 114 and DN 116 is proportional to the net charge injected into loop filter 106. When the frequency of OUT 112 divided by N is equal to the frequency of REF 110 divided by R, PLL 100 is "in lock". When "in lock", the DC voltage of loop filter 106 is constant and no net charge should be injected into loop filter 106.

To ensure the smallest instantaneous disturbance of the voltage input to loop filter 106, phase detector 102 is often designed so that inverted UP 114 and DN 116 terminate at the same time.

As shown in FIG. 2, charge pump 104 consists of two current sources: up current source 202 and down current source 204. The pulses of inverted UP 114 and DN 116 described earlier control the current sources, 202 and 204, respectively. When the PLL is in lock, the duration of inverted UP 114 and DN 116 should be identical. Consequently, the two currents should be equal ("matched"), i.e., the current in up current source 202 should equal the current in down current source 204.

In a "charge pump" event occurring at frequency F, corresponding to the operating frequency of charge pump 104, charge pump 104 periodically adjusts the voltage input to VCO 108, and consequently the frequency of OUT 112. Despite the PLL being in lock, a mismatch in the instantaneous currents of current sources 202 and 204 may still occur. FIG. 3A depicts a potential mismatch between currents $I_{up}$ and $-I_{dn}$ of up current source 202 and down current source 204, respectively, due to finite output impedance of the current sources. FIG. 3B depicts the instantaneous charge induced into loop filter 106 by the current mismatch depicted in FIG. 3A. DN 116 has slightly longer duration to compensate for the reduced magnitude of $-I_{dn}$, so that the net charge injected into the loop filter remains zero. At the conclusion of the charge pump event, the net charge added to the loop filter is zero.

FIG. 4 shows the energy spectrum of the charge pump event shown in FIGS. 3A and 3B. As shown in FIG. 4, the addition and subtraction of charge depicted in the example of FIG. 3B causes power "spurs" 300 ("spurious tones") that occur at a distance equal to multiples of the charge pump's operating frequency F on both sides of the frequency of OUT 112.

When the PLL is in lock, spurs are undesired. In communications systems, spurs may cause undesired distortions of signals and mixing with adjacent channels.

A solution to the spur problem was to design a charge pump with tolerable mismatch in currents during lock. However, because the output impedance of current sources in charge pumps is finite, current mismatch always occurred between the current supplies when the loop filter voltage is changed. So, a range of loop filter voltages established where the magnitude of the spurs were tolerable. However, the PLL was limited in output operating frequency range (tuning range) by the presence of spurious tones.

SUMMARY OF THE INVENTION

The present invention provides a device in a PLL circuit that dynamically matches the currents in a charge pump during a charge pump event when the PLL is in lock to reduce the spurious tones.

One embodiment of the present invention provides a phase-locked loop receiving a reference signal and an input signal which includes (1) a phase detector providing an output signal indicating a phase difference between the input signal and the reference signal; (2) a charge pump including first and second current sources configured such that an output net charge is proportional to the phase difference; and (3) a current matching device coupled to the first and second current sources, the current matching device matching the first and second currents. The current matching device adjusts the first current to equal the second current when an inverted up signal and a down signal do not arrive at the current matching device simultaneously.

The first current source further includes a capacitor responsive to the current matching device and coupled to the first current source that stores a control voltage across the first current source; a third current source that produces a third current of approximately 5 times a reference current; and a fourth current source that produces a fourth current of approximately 20% of the third and is responsive to the capacitor. The first current source is responsive to an inverted up signal and the current matching device. The first current includes the third current and the fourth current.

The second current source further includes a fifth current source that produces the second current of approximately 6 times a reference current. The second current source is responsive to a down signal.

A second embodiment of the present invention provides a phase-locked loop receiving a reference signal and an input signal which includes (1) a phase detector providing an output signal indicating a phase difference between the input signal and the reference signal; (2) a charge pump including first and second current sources configured such that an output net charge is proportional to the phase difference; and (3) a current matching device coupled to the first and second current sources, the current matching device matching the first and second currents. The current matching device adjusts the first current to equal the second current when an inverted up signal and a down signal do not arrive at the current matching device simultaneously.

The current matching device further includes an integrator circuit coupled to the first current source and including input terminals responsive to the charge pump that adjusts the first current to equal the second current when voltages at the input terminals are unequal. The integrator adjusts a voltage across a capacitor of the first current source until the voltages at the input terminals are approximately equal.

The first current source further includes a capacitor responsive to the current matching device that is coupled to the first current source that stores a voltage level; a third current source that produces a third current of approximately 5 times a reference current; and a fourth source that produces a fourth current of approximately 20% of the third current and is responsive to the capacitor. The first current source is responsive to an inverted up signal and the current matching device. The third current and the fourth current comprise the first current.

The second current source further includes a fifth current source that produces a second current of approximately 6 times a reference current. The second current source is responsive to a down signal.

An OFF signal allows the first and second currents to flow during a selected time.

A switch coupled across the input terminals closes to stop charge flow into a loop filter and opens prior to a charge pump event.

A third embodiment of the present invention provides a method of reducing cyclic net output charge leakage from a charge pump in a phase-locked loop with steps including (1) providing an output signal indicating a phase difference between an input signal and a reference signal; (2) providing an output current from the difference between first and second currents that is proportional to the phase difference; and (3) matching the first and second currents by a control method.

The control method further includes the steps of (A) receiving an inverted up signal and a down signal; (B) generating an output voltage in response to a difference between the received inverted up signal and a down signal; and (C) adjusting the first current to approximately equal the second current in response to the output voltage.

A fourth embodiment of the present invention provides a method of reducing cyclic net output charge leakage from a charge pump in a phase-locked loop with steps including (1) providing an output signal indicating a phase difference between an input signal and a reference signal; (2) providing an output current from the difference between first and second currents that is proportional to the phase difference; and (3) matching the first and second currents by a control method. The control method further includes the steps (A) allowing the output current to flow; (B) disallowing flow of the output current; and (C) matching the first current to the second current to reduce the output current.

The present invention is better understood upon consideration of the detailed description below, in conjunction with the accompanying drawings.

BRIEF DESCRIPTION OF THE DRAWINGS

FIG. 1 depicts phase-locked loop (PLL) 100 of the prior art showing phase detector 102, charge pump 104, loop filter 106, and voltage controlled oscillator (VCO) 108.

FIG. 5 depicts PLL 500 with current matching device 501/601 and charge pump 502.

DETAILED DESCRIPTION OF THE PREFERRED EMBODIMENTS

Figure 6:
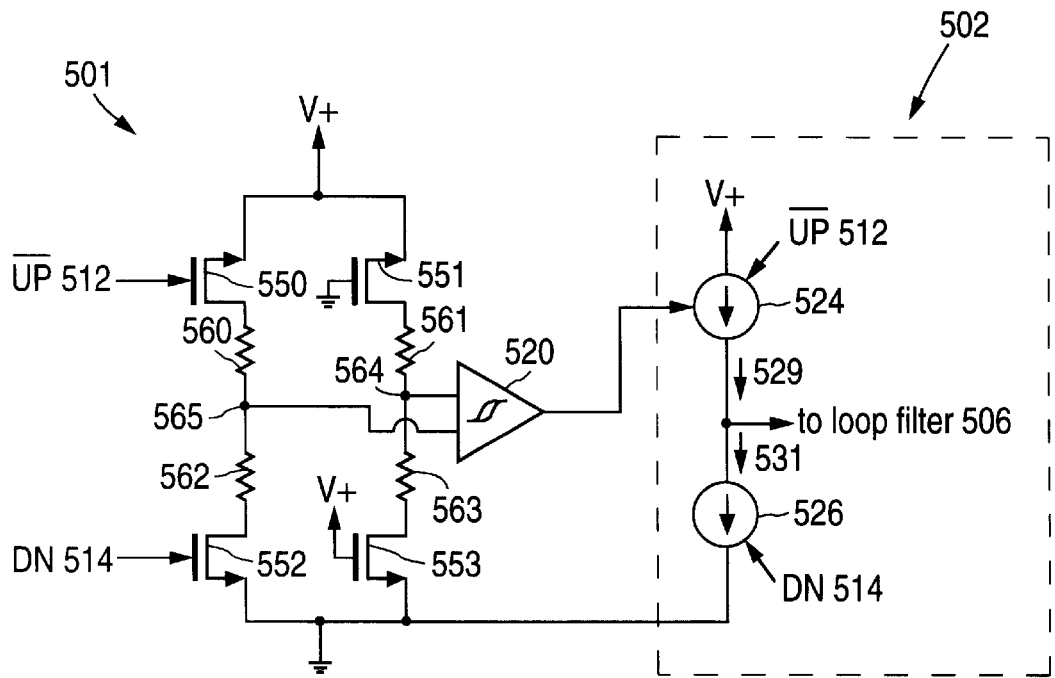
FIG. 6 depicts one embodiment of the present invention showing current matching device 501 and charge pump 502 of FIG. 5 in more detail.

FIG. 6 depicts one embodiment of the present invention showing current matching device 501. When PLL 500 is in lock and about a charge pump event, current matching device 501 dynamically matches first output current 529 to second output current 531 in charge pump 502 to reduce cyclic charge-based disturbances in loop filter 506. Consequently, spurious tones are greatly reduced.

Transistors 550, 551, 552, and 553 of current matching device 501 are switches operating in the linear region when turned on.

In this embodiment, when PLL 500 is in "lock", such term being known in the art, current matching device 501 operates to match first output current 529 to second output current 531. Locking is necessary before current matching device 501 can operate because when PLL 500 is in lock, the current from the charge pump can be adjusted without serious risk of sending PLL 500 into unstable oscillation. A suitable lock condition exists when, e.g., a minimum of four times in a row, pulses of inverted UP 512 and DN 514 arrive at current matching device 501 within 15 ns of one another.

Current matching device 501 is coupled to receive inverted UP 512 and DN 514 from phase detector 504. Difference in arrival times between inverted UP 512 and DN 514 corresponds to a mismatch between first output current 529 and second output current 531. Difference in arrival times corresponds to different voltages at the terminals of integrator 520, nodes 564 and 565, for the duration of the time that inverted UP 512 and DN 514 differ. When the pulses arrive at approximately the same time, the voltage at node 565 is approximately equal to the voltage at node 564. When the pulses do not arrive at approximately the same time, the voltages at node 565 and reference node 564 will be unequal for the duration of time that inverted UP 512 and DN 514 differ.

When the voltages at the input terminals of integrator 520 are unequal and when PLL 500 is in lock, integrator 520 outputs a voltage proportional to the difference in arrival times of the pulses. Integrator 520 varies the charge in capacitor 522 of FIG. 7 thereby causing a change in the gate-to-source voltage of transistor 570. Variable current 544 varies with the change in the gate-to-source voltage of transistor 570. Consequently, first output current 529 is matched to second output current 531 by varying variable current 544.

The propagation time for pulses of inverted UP 512 and DN 514 from respective inputs of current matching device 501 to inputs of integrator 520 are designed to be the same. Otherwise, current matching device 501 does not properly match first output current 529 to second output current 531 and some instantaneous charge will be induced into loop filter 506. Similarly, the time from when inverted UP 512 arrives at first current source 524 to the time first current source 524 generates current must match the time from when DN 514 arrives at second current source 526 to the time second current source 526 generates current.

The time constant of integrator 520 should be designed so that the adjustment in first output current 529 is gradual. Virtually instantaneous change of first output current 529 is not desirable and can cause instability in PLL 500. Further, the time constant of the integrator must be smaller than the time constant of loop filter 506 and larger than the period of the phase detector frequency.

Figure 7:
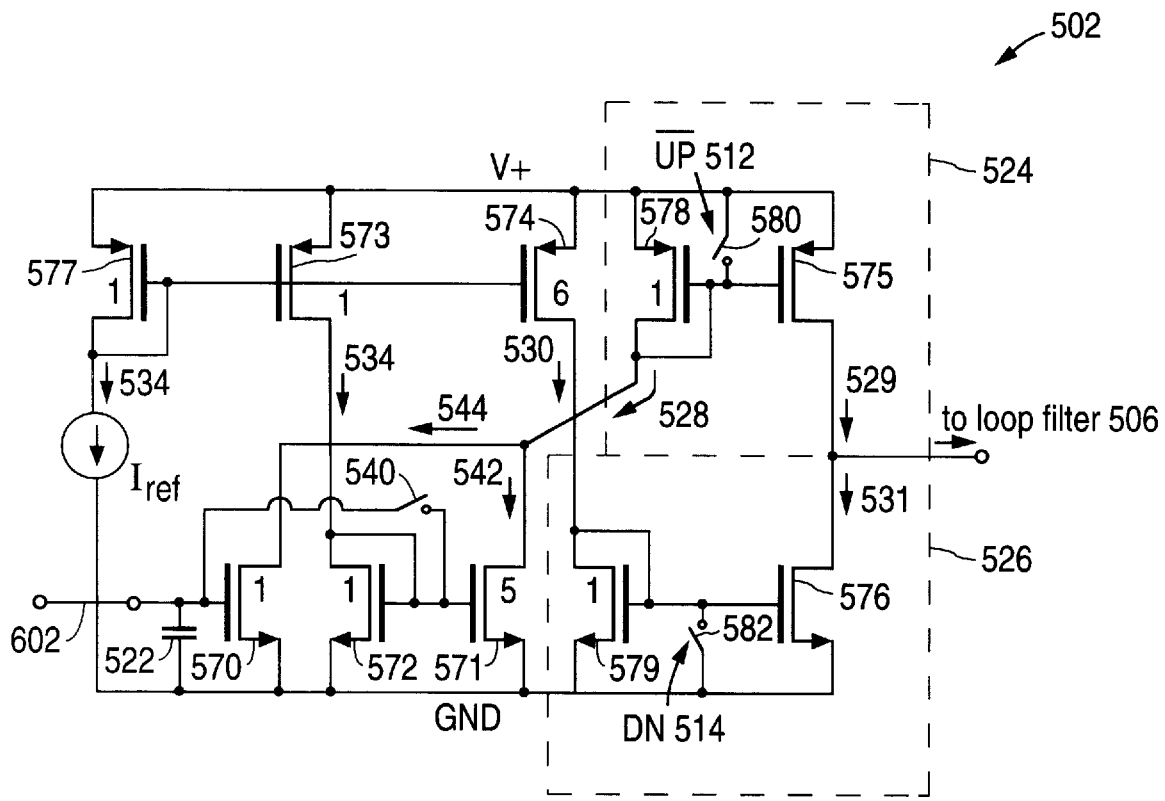
FIG. 7 depicts charge pump 502 which includes first current source 524 that is responsive to current matching device 501 of FIG. 6 or current matching device 601 of FIG. 9, and second current source 526 that is responsive to the output voltage of charge pump 502 of FIG. 5.

FIG. 7 depicts an implementation of first current source 524. First current source 524 receives first current 528 and provides first output current 529. Ideally, first output current 529 equals first current 528, where transistors 575 and 578 are identical. Realistically first output current 529 only approximately equals first current 528. First output current 529 can also be set as approximately N times first current 528. First output current 529 is provided when switch 580 is open. Switch 580 is responsive to inverted UP 512. A suitable implementation for the current mirror includes PMOS transistors, although other transistor types may be used. In this embodiment, mirror current 542 of transistor 571 is designed to be approximately 5 times reference current 534, although rational ratios may be used. In this embodiment, variable current 544 is approximately 20 percent of mirror current 542, although other ratios may be used.

FIG. 7 also depicts second current source 526. Second current source 526 receives second current 530 and provides second output current 531. Ideally, second output current 531 equals second current 530 where transistors 576 and 579 are identical. Realistically second output current 531 only approximately equals second current 530. Second output current 531 can also be set as approximately N times second current 530. Second current source 526 generates second output current 531 when switch 582 is open. Switch 582 is responsive to DN 514. A suitable implementation of second current source 526 includes NMOS transistors, although other transistor types may be used. In this embodiment, second current 530 and second output current 531 are designed to be approximately 6 times reference current 534, although other rational ratios may be used. In this embodiment, second current 530 and second output current 531 vary with the output voltage of charge pump 502. Second current 530 and second output current 531 should vary minimally with the output voltage of charge pump 502 because first output current 529 is adjusted to match it.

Figure 2:
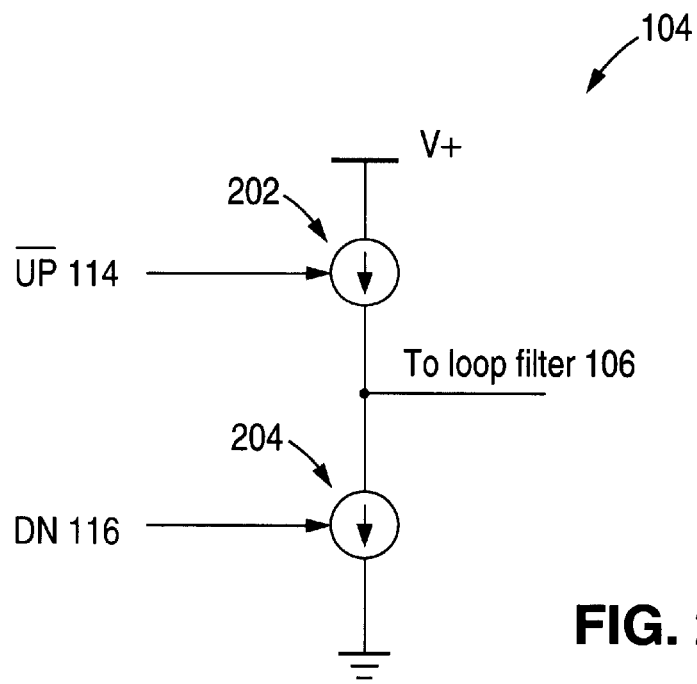
FIG. 2 depicts charge pump 104 of the prior art showing two current sources, up current source 202 and down current source 204.
Figure 3A:
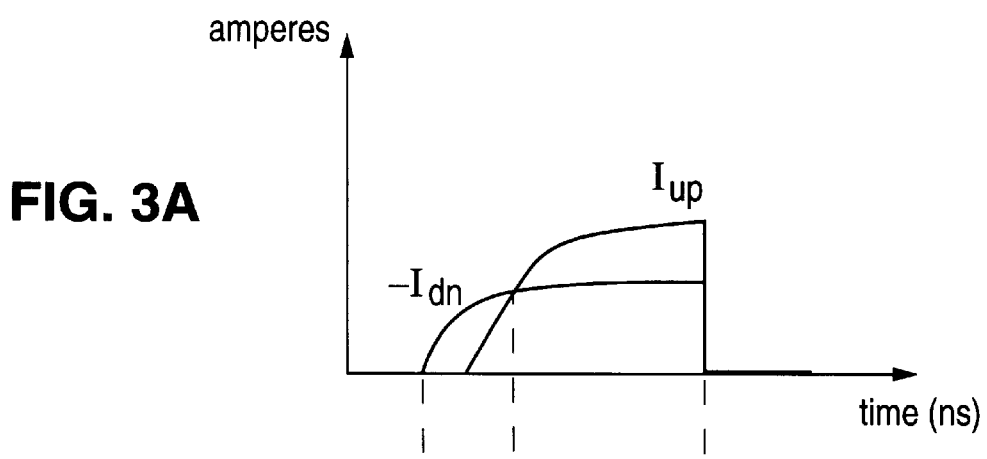
FIG. 3A depicts $I_{up}$ and $-I_{dn}$ of up current source 202 and down current source 204, respectively, and the mismatch that may occur.
Figure 3B:
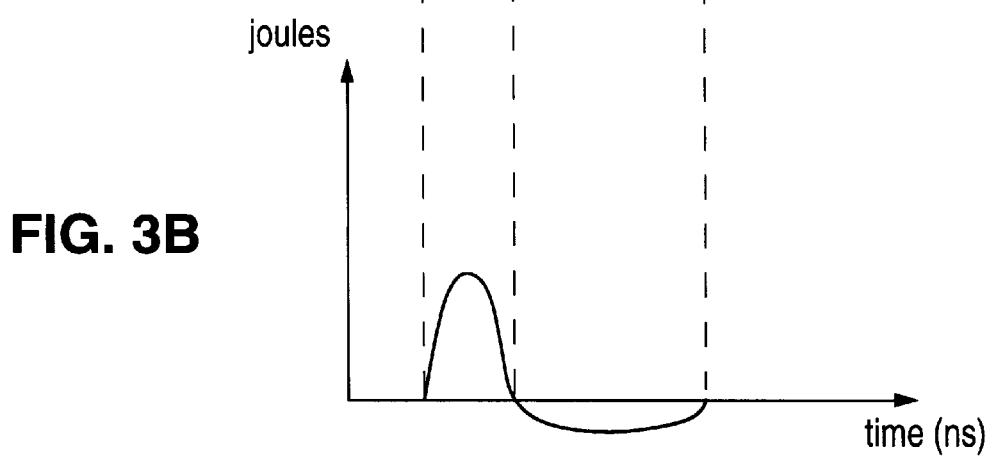
FIG. 3B depicts charge induced into loop filter 106 by the current mismatch depicted in FIG. 3A which causes spurious tones in the output of PLL 100.
Figure 4:
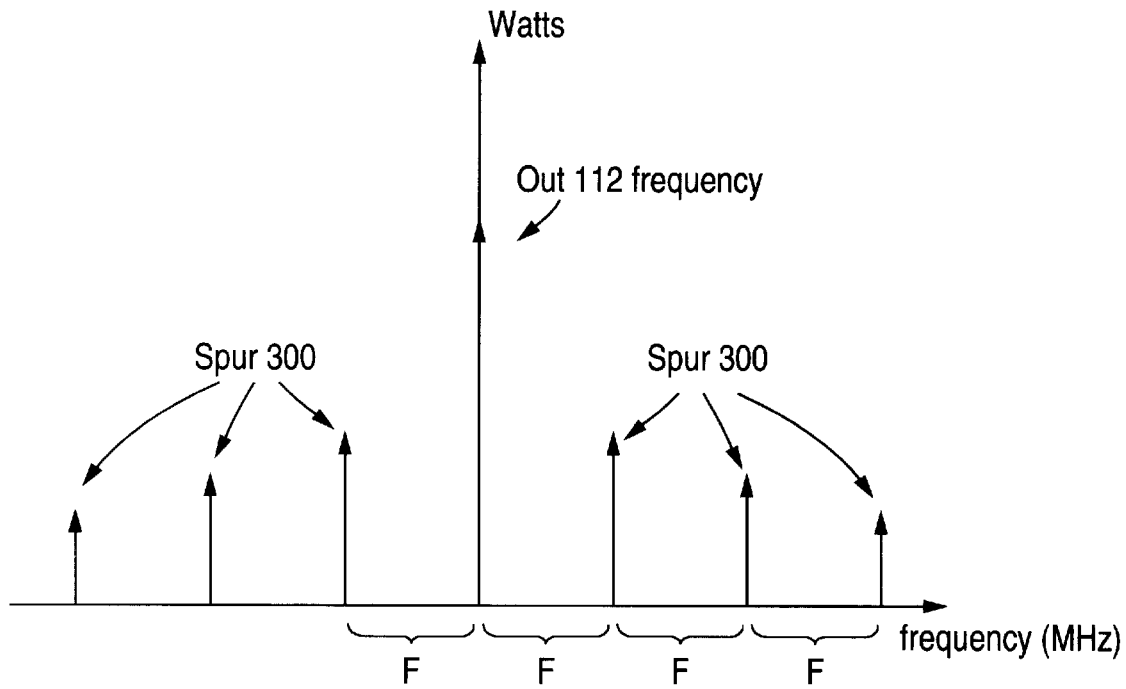
FIG. 4 depicts power spurs 300 caused by mismatched currents in charge pump 104 that occur at interval F from the frequency of OUT 112 of PLL 100.

First current source 524 corresponds to either the up current source 202 or down current source 204 in charge pump 104 of the prior art as depicted in FIG. 2. In this embodiment, first output current 529 corresponds to up current and second output current 531 corresponds to down current of FIG. 2.

The operation of first current source 524 and second current source 526 is next described. When PLL 500 is in lock, switch 540 is open, so current matching device 501 can vary variable current 544 because the gate voltage of transistor 570 can now differ from that of transistor 571. Capacitor 522 biases the gate terminal of transistor 570 thereby adjusting the level of variable current 544.

Conversely, when PLL 500 is not in lock, switch 540 is closed, so the gate voltage of transistor 570 equals that of transistor 571. In such case, first current 528 and second current 530 are both approximately 6 times reference current 534.

Figure 8:
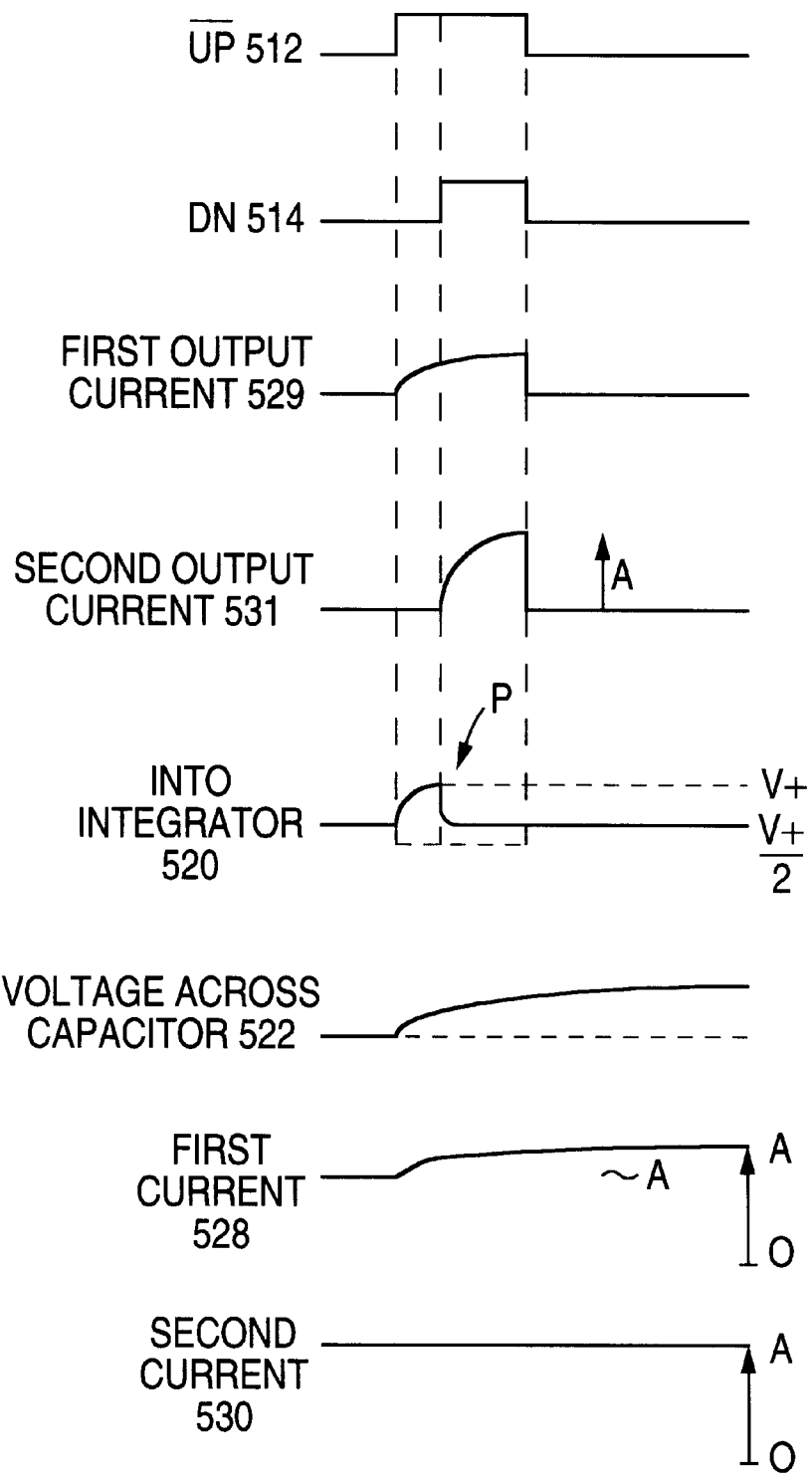
FIG. 8 depicts signals that may be produced during operation of current matching device 501 of FIG. 5 in which first output current 529 is matched to second output current 531.

For example, as depicted in FIG. 8, if a pulse of inverted UP 512 arrives to current matching device 501 before a pulse of DN 514, then first output current 529 is less than second output current 531. A voltage signal P is provided into integrator 520 at node 565, which in turn provides a voltage signal across capacitor 522. Consequently variable current 544 increases in order to match first output current 529 with second output current 531. First output current 529 and second output current 531 stop flowing after inverted UP 512 and DN 514 return to low states, before first output current 529 matches second output current 531 as a result of the integrator 520 time constant. Second current 530 is constant at level A. First current 528, which includes variable current 544, continues to increase to approximately match second current 530, approximately level A. Thereafter in a subsequent charge pump event, not depicted, first output current 529 and second output current 531 would be closer to matching.

The process of matching first output current 529 to second output current 531 is gradual, as it may, for example, occur over several charge pump events. The gradual matching is related to the time constant of integrator 520, described earlier.

Figure 9:
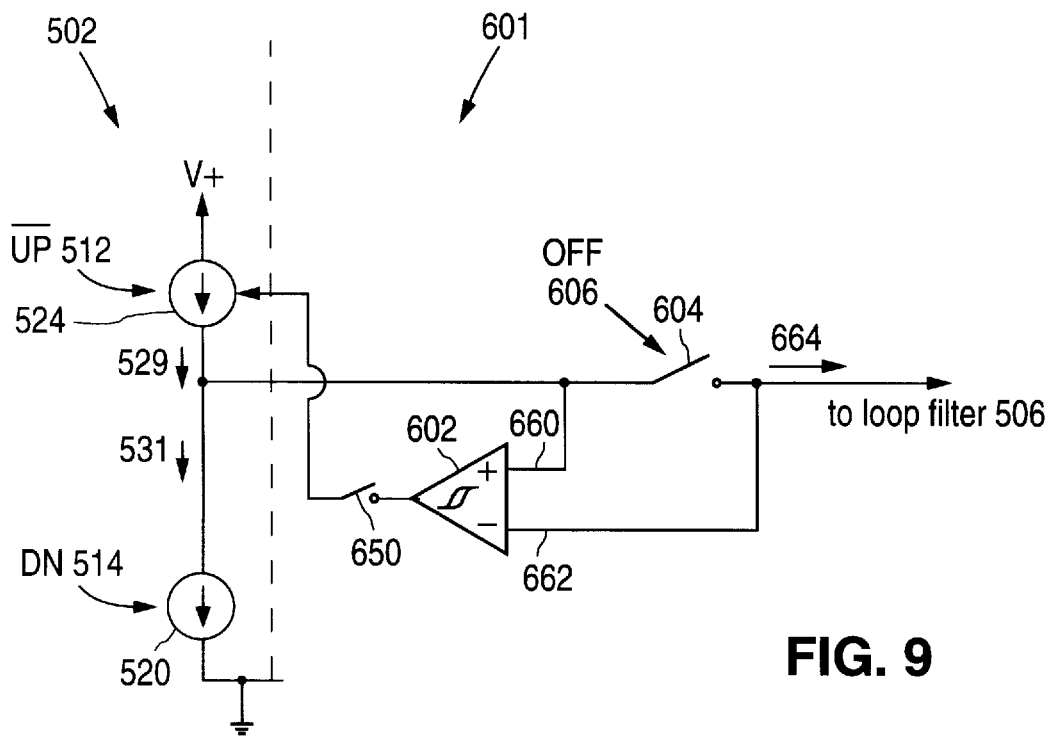
FIG. 9 depicts a second embodiment of the present invention showing current matching device 601 of FIG. 5 in more detail.

FIG. 9 depicts, in more detail, a second embodiment of the present invention in current matching device 601. As discussed above, current matching device 601 operates when PLL 500 is in lock, so that the current from the charge pump can be adjusted without serious risk of sending PLL 500 into unstable oscillation. Lock conditions are similar to those disclosed above for current matching device 501.

In current matching device 601, input terminals, 660 and 662, of integrator 602 are coupled across switch 604. Switch 604 is open and closed in response to a control signal, OFF 606. When switch 604 is open, a difference between first output current 529 and second output current 531 will result in different voltages at terminals 660 and 662. First current source 524 is coupled to receive inverted UP 512 from phase detector 504 of FIG. 5. Second current source 526 is coupled to receive DN 514 from phase detector 504 of FIG. 5. Integrator 602 matches first output current 529 to second output current 531.

Integrator 602 magnifies any voltage difference at its input terminals 660 and 662 when switch 604 is open and first and second output currents 529 and 531 are flowing. The input terminals of integrator 602 are coupled to detect any mismatch between first output current 529 and second output current 531. Where there is a mismatch between the first and second output currents, input terminals 660 and 662 of integrator 602 have different voltages. In such case, integrator 602 adjusts its output voltage until terminal 660 has approximately the same voltage as the voltage at the input terminals to loop filter 506, which corresponds to terminal 662. When the voltages at terminals 660 and 662 are approximately the same, the first and second output currents are approximately equal. The output terminal of integrator 602 is coupled to capacitor 522 of FIG. 7 that varies variable current 544. Integrator 602 is designed to vary the voltage across capacitor 522 to adjust variable current 544 until the voltages at terminals of integrator 602 are approximately equal, a condition which corresponds to first output current 529 approximately matching second output current 531.

The time constant of integrator 602 should be designed to be similar to that of integrator 520.

OFF 606 causes switch 604 to close before both first output current 529 and second output current 531 of charge pump 502 begin flowing in a charge pump event. After a time, OFF 606 causes switch 604 to open causing first output current 529 and second output current 531 to stop flowing to the loop filter although first current source 524 and second current source 526 remain on.

First current source 524 corresponds to either up current source 202 or down current source 204, in charge pump 104 of the prior art as depicted in FIG. 2. FIG. 7 depicts an implementation of first current source 524. First current source 524 is discussed above. FIG. 7 also depicts second current source 526. Second current source 526 is discussed above as well.

Figure 10:
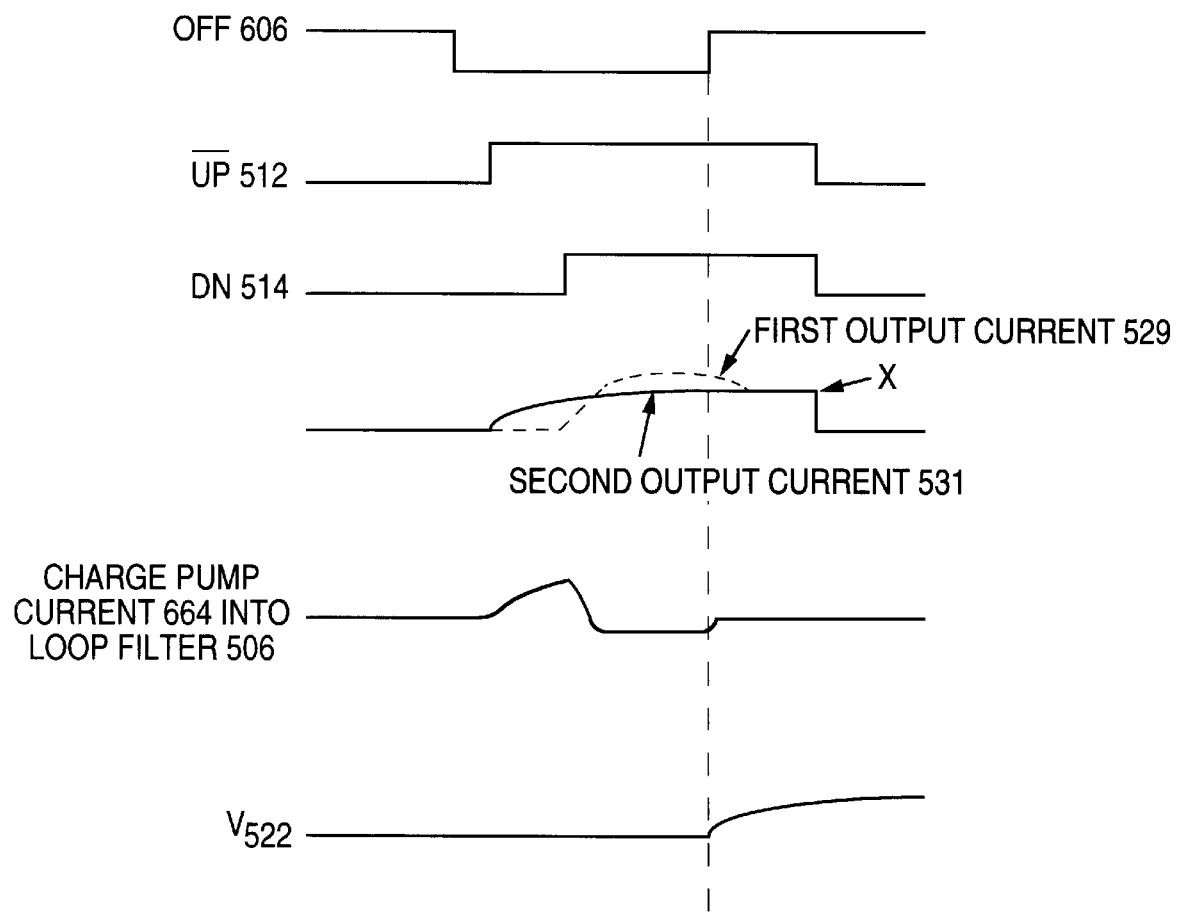
FIG. 10 depicts signals that may be produced during operation of current matching device 601 showing timing signals of OFF 606, the matching of first output current 529 to second output current 531, and charge pump current 664.

FIG. 10 depicts signal transitions during a period PLL 500 is in lock. OFF 606 is initially high so that switch 604 is open. Just before the charge pump event, OFF 606 is set low to close switch 604. First current source 524 and second current source 526 receive inverted UP 512 and DN 514 from phase detector 504, respectively, and begin to generate first output current 529 and second output current 531, respectively. Switch 604 is closed for a minimum time to minimize the flow of current from charge pump 502 into loop filter 506. OFF 606 is then set to high to open switch 604 and consequently to disconnect charge pump 502 from loop filter 506. Charge pump current 664, which corresponds to the difference between first output current 529 and second output current 531 and is injected into loop filter 506, returns to zero following the opening of switch 604. Switch 650 is then closed to enable operation of integrator 602. Any disparity between first output current 529 and second output current 531 corresponds to a mismatch in voltages at the input terminals 660 and 662. Integrator 602 adjusts the voltage across capacitor 522, $V_{522}$, until the voltages at input terminals 660 and 662 are approximately equal. Following matching of first current 529 to second current 531, switch 650 is then opened, at time X, and thereafter inverted UP 512 and DN 514 are forced back to low states thus ending the flow of first current 529 and second current 531, respectively. Current matching device 601 then awaits the next charge pump event.

In a locked PLL and during a charge pump event, power spurs caused by instantaneous charge injections from the charge pump are reduced. However, when opening and closing switch 604 as in the example above, charge injection, depicted as charge pump current 664, into loop filter 506 occurs, causing low level, tolerable power spurs.

As compared to current matching device 501, current matching device 601 more accurately matches up and down currents of the charge pump because the accuracy of matching in current matching device 601 is not as sensitive to the rate at which current sources of the charge pump reach their intended values as the in current matching device 501. In current matching device 501, accuracy of matching depends on the up and down current sources generating the same intended values at the same rate. Further, current matching device 601 also may function to match currents where the inverted UP and DN pulses arrive simultaneously. However, current matching device 601 is limited in its maximum phase detector operating frequency because of the extended duration of the charge pump event. Current matching device 601 should be employed in applications where its obtainable phase detector frequency is acceptable.

Current matching device 501 may function properly over a broader range of time constants because it is out of the loop but at lower frequencies, current leakage into transistors 550 and 552 occurs which causes the voltage at node 565 of integrator 520 to vary and consequently alters the output of integrator 520. A switch coupled to the output terminal of integrator 520 could be inserted to reduce the effect of charge leakage into loop filter 506 which operates like switch 650 in FIG. 9.

The foregoing description of the embodiments of the invention has been presented for purposes of illustration and description. It is not intended to be exhaustive or to limit the invention to the precise form disclosed. Numerous modifications or variations are possible in light of the above teachings. The embodiments were chosen and described to provide the best illustration of the principles of the invention and its practical application to thereby enable one of ordinary skill in the art to utilize the invention in various embodiments and with various modifications which are suited to the particular use contemplated.

What is claimed is:

1. A charge source that receives a reference signal and an input signal, said charge source comprising:
   (i) a phase detector providing an output signal indicating a phase difference between said input signal and said reference signal;
   (ii) a charge pump configured to provide an output net charge proportional to said phase difference, said charge pump including first and second current sources providing first and second currents, respectively, said first current source comprising:
      (a) a capacitive element coupled to said phase detector and that stores charge in proportion to said phase difference;

(b) a third current source that produces a third current of a fraction N of said first current; and (c) a fourth current source controlled by said capacitive element that produces a fourth current of a fraction (1−N) of said first current; and (iii) a current matching device, coupled to said first current source, matching said first and second currents.

2. The charge source of claim 1 wherein:

said first current includes said third current and said fourth current.

3. The charge source of claim 1, wherein said current matching device further comprises:

an integrator circuit coupled to said capacitive element and including input terminals responsive to said phase difference, wherein said integrator circuit adjusts said first current to equal said second current in response to a phase difference.

4. The charge source of claim 3, wherein said integrator adjusts a voltage across said capacitive element until said phase difference is approximately zero.

5. A phase-locked loop receiving a reference signal and an input signal comprising:

a phase detector providing an output signal indicating a phase difference between said input signal and said reference signal;

a charge pump including first and second current sources, wherein said charge pump is configured to provide an output net charge that is proportional to said phase difference, and wherein said first current source provides a first current and wherein said second current source provides a second current;

a current matching device coupled to said first and second current sources, said current matching device matching said first and second currents; and an integrator circuit coupled to said first current source and including input terminals responsive to said charge pump that adjusts said first current to equal said second current when voltages at said input terminals are unequal, wherein:

an OFF signal allows said first and second currents to flow during a selected time.

6. A phase-locked loop receiving a reference signal and an input signal comprising:

a phase detector providing an output signal indicating a phase difference between said input signal and said reference signal;

a charge pump including first and second current sources, wherein said charge pump is configured to provide an output net charge that is proportional to said phase difference, and wherein said first current source provides a first current and wherein said second current source provides a second current;

a current matching device coupled to said first and second current sources, said current matching device matching said first and second currents;

an integrator circuit coupled to said first current source and including input terminals responsive to said charge pump that adjusts said first current to equal said second current when voltages at said input terminals are unequal; and a switch coupled across said input terminals that closes to stop charge flow into a loop filter and opens prior to a charge pump event.

7. A charge source comprising:

a charge pump including first and second current sources, wherein said first current source provides a first current, said first current source includes a capacitive element that controls said first current, and said second current source provides a second current;

a loop filter coupled to said charge pump and to receive a difference between said first and second currents; and an integrator circuit that includes first and second input terminals and an output terminal, wherein said first input terminal is coupled to said charge pump and to receive a difference between said first and second currents, said second input terminal is coupled to said loop filter, and said output terminal is coupled to said capacitive element and sets said first current approximately equal to said second current by adjusting charge stored by said capacitive element.

8. The charge source of claim 7, further comprising:

a first switch that selectively couples said first and second input terminals together;

a second switch that selectively couples said output terminal to said capacitive element, wherein said first switch selectively closes to allow said loop filter to receive said difference between said first and second currents from said charge pump, and said second switch selectively closes to couple said output terminal of said integrator to said capacitive element to set said first current approximately equal to said second current.

* * * * *